United States Patent [19]

Kimura

[11] Patent Number: 5,306,968
[45] Date of Patent: Apr. 26, 1994

[54] RECTIFIER CIRCUIT NOT USING CLOCK SIGNAL

[75] Inventor: Katsuji Kimura, Tokyo, Japan

[73] Assignee: NEC Corporation, Tokyo, Japan

[21] Appl. No.: 955,403

[22] Filed: Oct. 2, 1992

[30] Foreign Application Priority Data

Oct. 4, 1991 [JP] Japan .................. 3-283982
Oct. 22, 1991 [JP] Japan .................. 3-302339
Nov. 28, 1991 [JP] Japan .................. 3-339899

[51] Int. Cl.$^5$ .......................................... H03F 3/45
[52] U.S. Cl. .................... 307/494; 307/529; 307/262; 307/236
[58] Field of Search ........... 307/494, 529, 555, 236, 307/262; 363/3, 8

[56] References Cited

U.S. PATENT DOCUMENTS

| | | | |
|---|---|---|---|
| 3,170,125 | 2/1965 | Thompson | 307/494 |
| 4,052,679 | 10/1977 | Hosoya | 307/262 |
| 4,435,656 | 3/1984 | Tomuro | 307/494 |
| 5,002,372 | 3/1991 | Nyqvist | 307/529 |
| 5,107,150 | 4/1992 | Kimura | 307/529 |

FOREIGN PATENT DOCUMENTS 1433070 4/1976 United Kingdom .
2131635 6/1984 United Kingdom .

OTHER PUBLICATIONS

"Design and Application of SC Circuit", Section 3.1, by Kenji Nakayama, published by Tokai University Publication Division 1985, pp. 36–47, 286 and one additional page (including English language summarized translation).

*Primary Examiner*—William L. Sikes
*Assistant Examiner*—Tuan T. Lam
*Attorney, Agent, or Firm*—Burns, Doane, Swecker & Mathis

[57] ABSTRACT

A rectifier circuit without using a clock signal is provided. In this circuit, a polarity judgment circuit receives an AC signal and judges the positive/negative polarity of voltage of the AC signal and output the polarity specification signal. A gain control circuit receives the polarity specification signal and outputs a first and a second gain control signals having different DC voltage differences between the times when the result of "Positive polarity" is shown and when the result of "Negative polarity" is shown. A first amplifier circuit amplifies the AC signal differentially, and a second amplifier circuit amplifies the AC signal thus amplified differentially again while gain controlled according to the first and second gain control signals. A rectified signal is outputted from differential output terminals of the second amplifier circuit.

16 Claims, 6 Drawing Sheets

RECTIFIER CIRCUIT NOT USING CLOCK SIGNAL

BACKGROUND OF THE INVENTION

1. Field of the Invention

This invention relates to a rectifier circuit for rectifying an alternating current signal on a full-wave or half-wave basis and more particularly, to a rectifier circuit which is adapted to be made of metal-oxide semiconductor (MOS) integrated circuits and does not use a clock signal.

2. Description of the Related Art

As a rectifier circuit realized on MOS integrated circuits, such as shown in FIG. 1 is known previously. The rectifier circuit shown in FIG. 1 utilizes a switched capacitor (SC) multiplication circuit (see "Design and Application of SC Circuit", Section 3.1, by Kenji Nakayama published by Tokai University Publication Division).

The circuit shown in FIG. 1 comprises an input terminal 1, an output terminal 2, an SC circuit 3, a comparator 4, a D-type flip-flop block 5, a capacitor C1, switches S1, S2, S3 and S4 and selective switches S5 and S6. The SC circuit 3 comprises an operation amplifier A31, capacitors C31 and C32 and switches S31, S32, S34 and S35. Then, $\phi 1$ and $\phi 2$ indicate clock signals.

The switches S1, S2, S3, S4, S31, S32, S33, S34 and S35 are controllably switched by the clock signal $\phi 1$ or $\phi 2$ respectively inputted, and when the clock signal $\phi 1$ or $\phi 2$ is of a high logic level (logic level "1"), they are closed and when it is of a low logic level (logic level "0"), they are opened.

The clock signals $\phi 1$ and $\phi 2$ each is a clock signal having a frequency as high as several ten times that of an alternating current signal applied to the input terminal 1 and when the clock signal $\phi 1$ is "1", the clock signal $\phi 2$ is "0" and when the clock signal $\phi 2$ is "1", the clock signal $\phi 1$ is "0", having a clock phase at which the clock signals $\phi 1$ and $\phi 2$ simultaneously become the logic level "0".

An alternating current signal applied to the input terminal 1 is sent through the switch S1 and the capacitor C1 to the negative side-input terminal of the comparator 4. The positive side-input terminal of the comparator 4 is connected to the ground. When the clock signal $\phi 1$ is "1", the switch S1 is closed thereby charging the capacitor C1 by the alternating current signal. At that time, the clock signal $\phi 2$ becomes "0" to make switch S4 open and as a result, the output signal of the comparator 4 is not applied to the input terminal D of the flip-flop block 5.

When the clock signal $\phi 2$ is "1", the switches S2 and S4 are closed and as a result, the electric charge stored in the capacitor C1 is discharged and the output signal of the comparator 4 at that time is applied to the input terminal D of the flip-flop block 5.

When the clock signal $\phi 2$ is "1", if the alternating current signal is of the "positive polarity", the output signal of the comparator 4 becomes "1", and if is of the "negative polarity", the output of the comparator becomes "0". Besides, the switch S4 and the flip-flop block 5 make a sample-hold circuit and as a result, the output signal of the flip-flop block 5 becomes "1" while the alternating current signal has the positive polarity and becomes "0" while it has the negative polarity, and the output signal $\overline{Q}$ (inverted signal of an output signal Q outputted from an output terminal $\overline{Q}$) becomes the logic level opposite thereto.

The selective switch 5 is controlled by the output signal Q outputted from the output terminal Q and the switch S6 is controlled by the inverted output signal $\overline{Q}$ of the flip-flop block 5, thereby selectively outputting the clock signal $\phi 1$ or $\phi 2$ from the output terminals Q and $\overline{Q}$. Namely, the selective switch S5 outputs the clock signal $\phi 1$ while the alternating current signal is being the positive polarity and outputs the clock signal $\phi 2$ while it has the negative polarity. Inversely, the selective switch S6 outputs the clock signal $\phi 1$ while the alternating current signal has the positive polarity and outputs the clock signal $\phi 1$ while it has the negative polarity.

The clock signal $\phi 1$ or $\phi 2$ outputted from the selective switch S5 controls the switch 31 of the SC multiplication circuit 3 and on the other hand, the clock signal $\phi 2$ or $\phi 1$ outputted from the selective switch S6 controls the switch S32 of the SC multiplication circuit 3. When the switch S31 is controllably switched by the clock signal $\phi 1$ and the switch S32 is controllably switched by the clock signal $\phi 2$, the SC multiplication circuit 3 executes the "positive-phase multiplying operation". Namely, when the input voltage from the input terminal 1 is expressed as VIN, the output signal from the output terminal 2 is expressed as VOUT and the capacity of the capacitor C32 is supposed to be set as high as K' times that of the capacitor C31, the output voltage VOUT may be expressed as follows:

$$VOUT = K' \cdot VIN$$

On the other hand, when the switch S31 is controllably switched by the clock signal $\phi 2$ and the switch S32 is controllably switched by the clock signal $\phi 1$, the SC multiplication circuit 3 executes the "negative-phase multiplying operation" and the output signal VOUT may be expressed as follows;

$$VOUT = -K' \cdot VIN$$

As a result, when an alternating current signal applied to the input terminal 1 is of the positive polarity, the output terminal 2 outputs a positive-phase signal having an amplitude K' times that of the alternating current signal and, on the other hand, when the alternating current signal is of the negative polarity, the output terminal 2 outputs an opposite-phase signal having an amplitude K' times that of the alternating current signal. Thus, such a signal that the inputted alternating current signal is full-wave rectified can be obtained.

In the circuit shown in FIG. 1, a switch is disposed between the input terminal 1 and the SC multiplication circuit 3, and when the alternating current signal is being the positive polarity, the switch thus disposed is closed to send the alternating current signal to the SC multiplication circuit 3 and on the other hand, when it is being the negative polarity, the switch thus disposed is made open not to send the alternating current signal to the SC multiplication circuit 3, thus such a signal may be obtained that the inputted alternating current signal is half-wave rectified.

With the conventional rectifier circuit shown above, however, as the clock signal is used, there arises such a problem that a rectified signal having a good signal-to-noise (S/N) ratio cannot be obtained influenced by the generation of clock noise. In addition, the circuit itself is complex in structure and large in scale and unavoidably large in chip-size and power consumption when to make it of MOS integrated circuits.

Thus, an object of this invention is to provide a rectifier circuit without using a clock signal.

Another object of this invention is to provide a rectifier circuit realizable with MOS integrated circuits which are small in circuit-scale.

SUMMARY OF THE INVENTION (1) In a first aspect of this invention a rectifier circuit which is capable either of a full-wave rectification or a half-wave rectification without using a clock signals is provided. This rectifier circuit comprises a polarity judgment circuit, a gain control circuit, a first amplifier circuit and a second amplifier circuit.

The polarity judgment circuit receives an AC signal and judges the positive/negative polarity of voltage of the AC signal to output the polarity specification signal.

The gain control circuit receives the polarity specification signal and outputs two DC signals, a first gain control signal and a second gain control signal, having a different DC voltage difference between the times when the polarity specification signal shows the judged result of "Positive polarity" and when the polarity specification signal shows the judged result of "Negative polarity".

The first amplifier circuit comprises a first transistor pair connected to a constant current source, and receives the AC signal to amplify the AC signal differentially.

The second amplifier circuit comprises a second differential transistor pair and a third differential transistor pair, the differential input terminals of which are connected in common respectively. These transistor pairs receive the first gain control signal and the second gain control signal through the differential input terminals respectively, to be gain controlled by the DC voltage difference between the first gain control signal and the second gain control signal.

The second differential transistor pair is connected to one transistor of the first differential transistor pair as well as the third differential transistor pair is connected to the other transistor of the first differential transistor pair. In addition, the differential output terminal of the second differential transistor pair and the differential output terminal of the third differential transistor pair are connected in common, and a rectifier signal is outputted from the differential output terminals thus connected in common. In the transistors of the second differential transistor pair and the third differential transistor pair, the differential input terminals of the transistors, whose differential output terminals are not connected each other, are connected in common.

In the rectifier circuit of the first aspect, the AC signals are inputted to the polarity judgment circuit and the first amplification circuit. The polarity judgment circuit judges the positive/negative polarity of voltage of the AC signal to output the judged result called "Positive polarity" or the judged result called "Negative polarity". These polarity specification signals are inputted in the gain control circuit, and from the gain control circuit, two DC signals, namely, the first gain control signal and the second gain control signal are outputted. Conforming to the polarity specification signals, the DC voltage difference between the first gain control signal and the second gain control signal exhibits different values when the polarity specification signal shows the judged result of "Positive polarity" and when the polarity specification signal shows the judged result of "Negative polarity".

The AC signal inputted to the first amplification circuit is amplified differentially by the first differential transistor pair, which composes the first amplifier circuit, and a differential output signal thus connects to the second differential transistor pair and the third differential transistor pair which compose the second amplifier circuit. Namely, the output signal of one side transistor of the first differential transistor pair drives the second differential transistor pair and the output signal of the other transistor of the first differential transistor pair drives the third differential transistor pair.

The first gain control signal and the second gain control signal, which are outputted from the gain control circuit, a E inputted to the second amplifier circuit to control the amplification gains of the second differential transistor pair and the third differential transistor pair. Namely, the first gain control signal and the second gain control signal are applied to the differential input terminal of the second differential transistor pair, and the second differential transistor pair is gain controlled by the DC voltage difference between the first gain control signal and the second gain control signal. In the same way as above, the first gain control signal and the second gain control signal are applied to the differential input terminal of the third differential transistor pair also, and the third differential transistor pair is gain controlled by the DC voltage difference between both signals.

The result that the amplification operation is performed using the second amplifier which has been gain controlled in such way is obtained from the differential output terminals of the second differential transistor pair and from the differential output terminals of the third differential transistor pair, however, since these differential output terminals are connected in common, each differential output signal is synthesized to become one differential output signal.

The connecting relation of the differential output terminals is in the reverse relation with the relation of the common connection of the differential input terminals to which the first gain control signal and the second gain control signal are applied. Namely, for the mutual relation between the second differential transistor pair and the third differential transistor pair, in the input side, the mutual input terminals to which the first gain control signal (or the second gain control signal) is to be inputted are connected in common. While, in the output side, the output terminal of the transistor, to which the first gain control signal (or the second gain control signal) is to be inputted, and the output terminal of the transistor, to which the second gain control signal (or the first gain control signal) is to be inputted, are connected in common.

According to the circuit action above, a rectified signal can be obtained from the differential output of the second amplifier circuit. Namely, when the DC voltage difference between the first gain control signal and the second gain control signal is assumed as $+\Delta V$ ($\Delta V > 0$) which is the predetermined specified value when the AC input signal is "Positive polarity", and when the DC voltage difference is assumed as $-\Delta V$ for "Negative polarity", and if the second amplifier circuit is gain controlled by the DC voltage difference whose $+\Delta V$ and $-\Delta V$ are different, when assuming the voltage of AC input signal to VIN, the voltage VOUT of differential output of the second amplification circuit is shown in the following expression, and a full-wave rectifier signal can be obtained while K is set to a constant.

$$VOUT \simeq K \cdot (\pm \Delta V) \cdot VIN \simeq K \cdot \Delta V \cdot |VIN|$$

Also, for example, when the DC voltage difference ($-\Delta V$) for "Negative polarity" is set to zero, namely, when a gain control is performed by the DC voltage difference between $+\Delta V$ and zero, a half-wave rectifier signal can be obtained.

In the rectifier circuit of this first aspect, since a full-wave rectifier signal or a half-wave rectifier signal can be obtained without using a clock signal, there is no influence of clock noise, therefore, a rectified signal having a good signal to noise ratio (S/N) can be obtained. In addition, since a scale of circuit is smaller, the MOS integrated circuit can be realized in which a chip size is minimized and the current consumption is fewer.

The polarity judgment circuit preferablly is composed of a comparator. The gain control circuit preferably comprises a switching element which select and output two different voltage corresponding to the judged result of the polarity judgment circuit. The first to third differential transistor pairs above preferablly composed of MOS transistors.

(2) In a second aspect of this invention, a full-wave rectifier circuit without using a clock signal is provided. This full-wave rectifier circuit comprises a first amplifier circuit, a differential output current generation circuit and a second amplifier circuit.

The first amplifier circuit comprises two sets of differential transistor pairs in which the capacity value of one transistor is A time (A>1) of the capacity value of the other transistor respectively. Between the two sets of differential transistor pairs, in the input side, the transistors whose capacity values are different are connected in common to form one input stage, and in the output side, the transistors whose capacity values are the same are connected in common to form one output stage. The first amplifier circuit is driven at a constant current, and the AC signal applied to the input stage is amplified differentially.

The differential output current generation circuit is connected to the output stage of the first amplifier circuit, in addition, the circuit generates by the current mirror operation a differential output current which includes a DC component current of constant value obtained as a current difference of output currents of the first amplifier circuit and determined in relation to the constant current, and an AC component current which changes in relation to the voltage of the AC signal.

The second amplifier circuit is connected to the output stage of the differential output current generation circuit and is provided with means for removing the DC component current from the differential output current. The AC component current obtained by removing the DC component current generates a full-wave rectified signal of the AC signal by driving the transistor which compose the second amplifier circuit.

In the full-wave rectifier circuit of this second aspect, the AC signal applied to the input stage of the first amplifier circuit is amplified differentially by each of two sets differential transistor pairs which compose the first amplifier circuit. In this case, when the relation of common connection in the input side of these two sets of the differential transistor pairs is considered, each of two sets of the differential transistor pairs amplifies differentially the AC signal of reverse polarity mutually. In the output stage of the first amplifier circuit, the differential output of one differential transistor pair and the differential output of the other differential transistor pair are synthesized to make one differential output.

The differential output current generation circuit receives the differential output current of the first amplifier circuit to generate the current difference of the differential output current according to the current mirror operation. The current difference is composed of the DC component current of constant value which is determined in relation to the constant current for driving the differential transistor pair of the first amplifier circuit and of the AC component current which changes in relation to the AC signal voltage inputted to the differential transistor pair.

The second amplifier circuit receives the current difference output from the differential output current generation circuit, and obtains the AC component current by removing the DC component current from it. Therefore, when the transistor composing the second amplifier circuit is driven according to the AC component current, the full-wave rectified signal of the AC signal can be obtained.

Also in the rectifier circuit of this second aspect, the full-wave rectifier signal can be obtained without using a clock signal, and a signal of circuit is small. Therefore, the same effect as the case of the first aspect can be obtained.

In the rectifier circuit of this second aspect, the "Capacity value" above means the ratio (W/L) between the gate width (W) and the gate length (L) in the case of an MOS transistor. Therefore, it is enough that the ratio (W/L) of one transistor composing the differential transistor pair is A times of the ratio (W/L) of the other transistor thereof.

In the case of a bipolar transistor, the "Capacity value" means the emitter area. Therefore, it is enough that the emitter area of one transistor composing the differential transistor pair is A times of the emitter area of the other transistor thereof.

The differential transistor pair and first and second amplifier circuits are preferably composed of MOS transistors. The differential output current generation circuit preferably comprises three current mirror circuits. The means for removing the DC component current from the differential output current generated from the differential output current generation circuit is preferably conmposed of a constant current source.

For the transistor of the second amplifier circuit, it is preferably to be provided with a bias voltage source which supplies a voltage to cancel the bias voltage included in the full-wave rectified signal.

(3) In a third aspect of this invention, a rectifier circuit which is capable either of a full-wave rectification or a half-wave rectification without using a clock signal is provided. This rectifier circuit comprises a polarity judgment circuit, a first differential amplifier circuit, a second differential amplifier circuit, and differential output terminals.

The polarity judgment circuit receives an AC signal and judges the positive/negative polarity of voltage of the AC signal to output a first DC signal and a second DC signal which have different specified DC voltage differences in the cases of "Positive polarity" and "Negative polarity".

The first differential amplifier circuit comprises two sets of differential transistor pairs in which the capacity value of one transistor is A times (A>1) of the capacity value of the other transistor respectively, and these transistor pairs each having a constant current. Between these two sets of differential transistor pairs, in the input side, an input terminal pair is formed by connecting the transistor of one set of the transistor pair whose capacity value is larger and the transistor of the other set of the transistor pair whose capacity value is smaller. And in the output side, the output terminal pair is formed by connecting the transistors of the two sets of the transistor pairs whose capacity values are larger and by connecting the transistors of the other set of the transistor pairs whose capacity values are smaller. The AC signal is applied to one terminal of the input terminal pair and the first DC signal is applied to the other terminal of the input terminal pair to be amplified by the first differential amplifier circuit differentially. A first differential output signal is outputted from the output terminal pair.

The second differential amplifier circuit is of the same circuit construction as the first differential amplifier circuit. The AC signal is applied to one terminal of the input terminal pair and the second DC signal is applied to the other terminal of the input terminal pair to be amplified by the second differential amplifier circuit differentially. A second differential output signal is outputted from the output terminal pair.

The differential output terminals are connected so that the first differential output signal and the second differential output signal may be synthesized on antiphase basis.

In the rectifier circuit of this third aspect, the AC signals is inputted to the polarity judgment circuit, the first differential amplifier circuit, and the second differential amplifier circuit. In the polarity judgment circuit, the positive/negative polarity of voltage of the AC signal is judged first. Confirming to the judged result, the first DC signal and the second DC signal are generated to be outputted. The first DC signal and the second DC signal have different DC voltage differences of predetermined specified values, and the DC voltage differences are different in the cases of "Positive polarity" and "Negative polarity" of the AC signal voltage. The first DC signal is inputted to the first differential amplifier circuit and the second DC signal is inputted in the second differential amplifier circuit.

In the first differential amplifier circuit, the AC signal and the first DC signal are amplified differentially by the two sets of the differential transistor pair and, the first differential output signal is generated to be outputted to the output terminal pair. In the second differential amplifier circuit, the AC signal and the second DC signal are amplified differentially by the two sets of the differential transistor pair and, the second differential output signal is generated to be outputted to the output terminal pair. The first differential output signal and the second differential output signal are sent to the differential output terminal so as to become the reverse synthesis. According to the reverse synthesis connection, the differential output signal is generated to be outputted.

Namely, when the voltage VIN of the AC signal is "Positive polarity", the DC voltage difference between the first DC signal and the second DC signal shall be $+\Delta E$ (or $-\Delta E$) which is the predeterined specified value, and when the voltage VIN of AC signal is "Negative polarity", the DC voltage difference above shall be $-\Delta E$ (or $+\Delta E$) which is the predetermined specified value. The first DC signal and the second DC signal having the different DC voltage differences of $+\Delta E$ and $-\Delta E$ are thus generated to be differentially amplified with the AC signal. When the first differential output signal and the second differential output signal are synthesized so as to become the reverse phase, the voltage VOUT between the differential output terminals becomes $$VOUT = B \cdot (\pm \Delta E) \cdot VIN = B \cdot (\Delta E) \cdot |VIN| \quad (B \text{ is constant}),$$

and the full-wave rectified signal can be obtained.

In the description above, when the predetermined specified value only is set to zero for "Negative polarity" (or for "Positive polarity"), namely, in case that the first DC signal and the second DC signal having the DC current differences $+\Delta E$ (or $-\Delta E$) and Zero are generated, the half-wave rectified signal can be obtained.

In the rectifier circuit of this third aspect, a full-wave rectified signal or a half-wave rectified signal can be obtained without using a clock signal, and a scale of circuit is also small. Therefore, in this case, the same effect as the cases of first and second aspects can be obtained.

In the same way as the case of the second aspect, in the rectifier circuit of this third aspect, the "Capacity value" means a ratio (W/L) between the gate width (W) and the gate length (L) in the case of a MOS transistor. Therefore, it is enough that the ratio (W/L) of one transistor composing the differential transistor pair is A times of the ratio (W/L) of the other transistor thereof.

In the case of a bipolar transistor, the "Capacity value" means an emitter area. Therefore, it is enough that the emitter area of one transistor composing the differential transistor pair is A times of the emitter area of the other transistor thereof.

The polarity judgment circuit preferably comprises a comparator and a switching element which selects and outputs different two types of DC signals corresponding to the output of the comparator.

DESCRIPTION OF THE PREFERRED EMBODIMENTS

Figure 1:
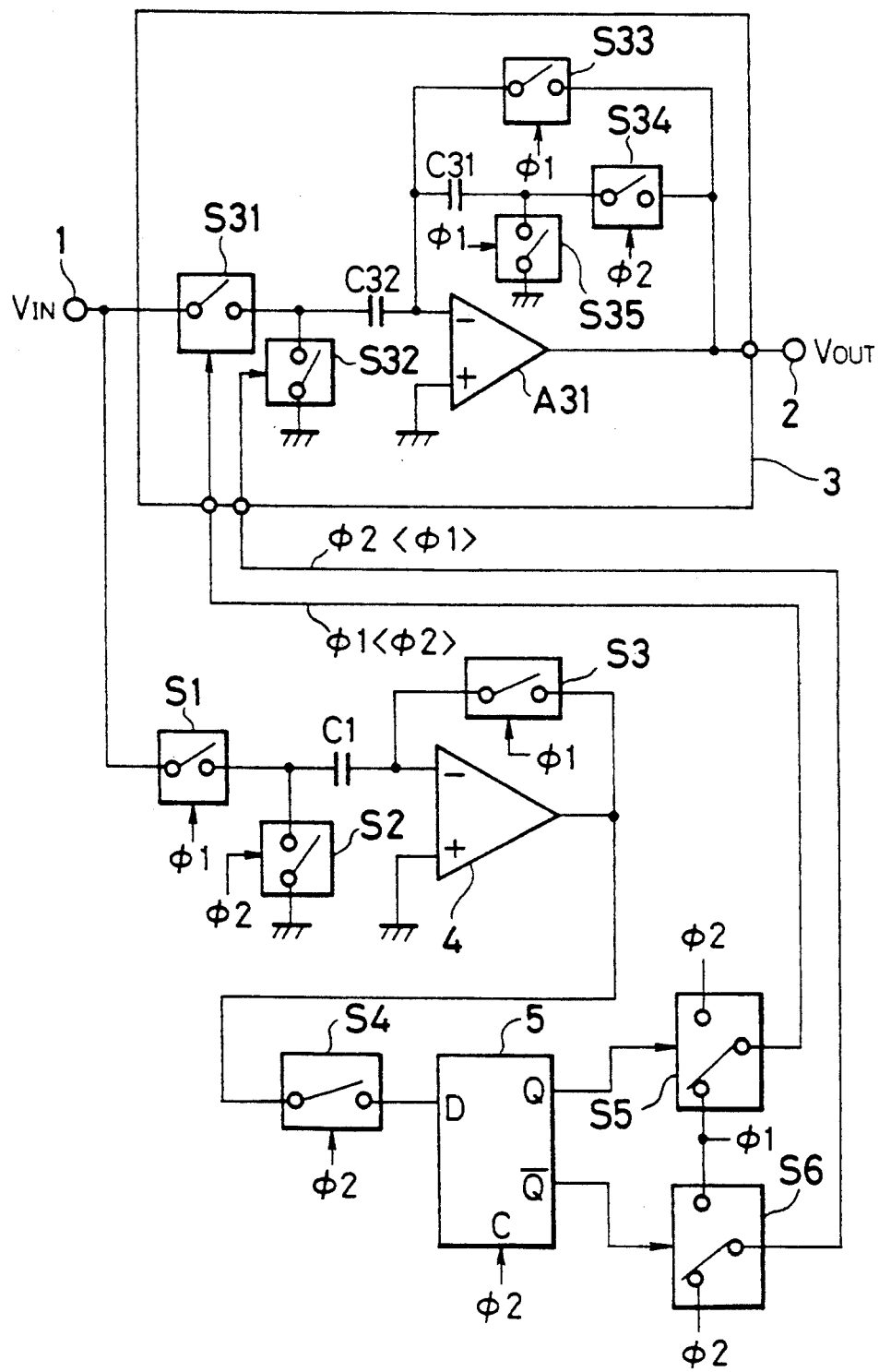
FIG. 1 is a circuit diagram of a conventional rectifier circuit.

Preferred embodiments of this invention will be described below while referring to the drawings attached.

First Embodiment

Figure 2:
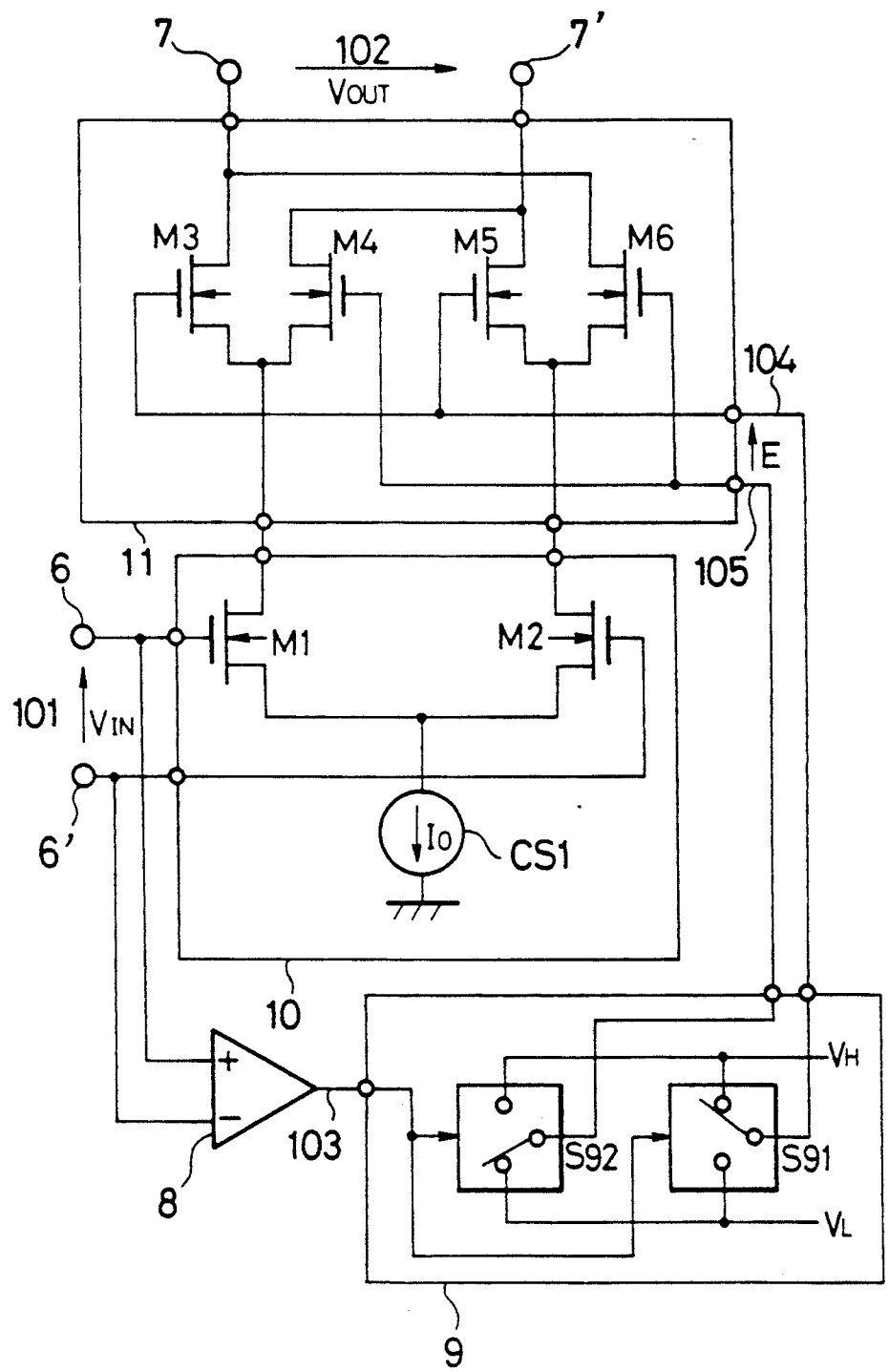
FIG. 2 is a circuit diagram of a full-wave rectifier circuit according to a first embodiment of this invention.

FIG. 2 shows a full-wave rectifier circuit according to a first embodiment of this invention, which is a rectifier circuit to be realized with a MOS integrated circuit.

In FIG. 2, an alternating current signal (AC signal) 101 is applied to an input terminal pair (6 and 6)' and a rectified signal 102 is sent out from an output terminal pair (7 and 7'). A comparator 8 serves to act as a polarity judging circuit for judging the polarity, positive or negative, of the AC signal 101.

A gain control circuit 9 has selective switches S91 and S92 and outputs a first gain control signal 104 and a second gain control signal 105 simultaneously to a second amplifier circuit 11 in response to a polarity specifying signal 103 which is an output signal of the comparator 8. In this embodiment, one terminals of the switches S91 and S92 are respectively supplied with a direct-current signal having a high level direct-current (DC) voltage VH and the other terminals thereof are respectively supplied with a direct-current signal having a low level direct-current (DC) voltage VL (VH>VL). As a result, for example, when the selective switch S91 outputs the low level DC voltage VL, the switch S92 outputs the high level DC voltage VH simultaneously.

A first amplifier circuit 10 comprises a first differential transistor pair composed of MOS transistors M1 and M2 and a constant current source CS1 for generating a constant current IO, thereby receiving the AC signal 101 for differentially amplifying the same. The first differential transistor pair (M1 and M2) has the gates connected respectively to the input terminal pair (6 and 6') and the sources connected in common to the constant current source CS1. The drain of the transistor M1 is connected in common to the sources of a second differential transistor pair composed of MOS transistors M3 and M4, and the drain of the transistor M2 is connected in common to the sources of a third differential transistor pair composed of MOS transistors M5 and M6.

A second amplifier circuit 11 comprises the second differential transistor pair composed of the transistors M3 and M4 and the third differential transistor pair composed of the transistors M5 and M6. The second transistor pair (M3 and M4) are connected to the output signal of the transistor M1 of the first amplifier circuit 10, the third differential transistor pair (M5 and M6) are driven by the output signal of the transistor M2 of the first amplifier circuit 10 and the rectified signal 102 is outputted from the output terminal pair (7 and 7'). The second amplifier circuit 11 is controlled its amplification gain by the direct-current voltage difference between the first gain control signal 104 and the second gain control signal 105 outputted from the gain control circuit 9.

The gates of the transistors M3 and M5 are connected in common to be applied with the first gate control signal 104. The gates of the transistors M4 and M6 are connected in common to be applied with the second gain control signal 105. The drains of the transistors M3 and M6 are connected in common and the drains of the transistors M4 and M5 are connected in common, thus respectively forming one differential outputs signal and being sent to the output terminal pair (7 and 7').

As explained above, the common connection of the differential output terminals, namely of the drains, between the second differential transistor pair (M3 and M4) and the third differential transistor pair (M5 and M6) is made opposite to the common connection of the input terminals, namely of the gates therebetween. This means that out of the respective transistors of the second differential transistor pair (M3 and M4) and third differential transistor pair (M5 and M6), the differential input terminals (the gates) of the transistors whose differential output terminals (the drains) are not connected to each other are connected in common.

The first and second amplifiers circuit 10 and 11 are identical in structure to the Gilbert multiplier.

Next, the operational principle of the rectifier circuit as shown above will be described below.

The AC signal 101 applied to the input terminal pair (6 and 6') is sent respectively to the input terminal pair (+ and − sides) of the comparator 8 and the gates of the first differential transistor pair (M1 and M2). The comparator 8 judges the polarity, positive or negative, of the AC signal 101 and outputs a polarity specifying signal 103 of the high logic level (logic level "1") when judged to be positive and, outputs the polarity specifying signal 103 of the low logic level (logic level "0") when judged to be negative.

The polarity specifying signal 103 is sent to the gain control circuit 9 to control the selective switches S91 and S92 in accordance with the signal 103. The selective switch S91 selects the DC voltage VH when the polarity specifying signal is "1", and selects the DC voltage VL when it is "0". The selective switch S92 selects the DC voltage VL when the polarity specifying signal is "1" and selects the DC voltage VH when it is "0". Thus, the first gain control signal 104 outputted from the selective switch S91 becomes a DC signal with the voltage VH when the AC singnal 101 is of the positive polarity and becomes a DC signal with the voltage VL when it is of the negative polarity. The second gain control signal 105 outputted from the selective switch S92 becomes a DC signal with the voltage VL when the signal 101 is positive in polarity and becomes a DC signal with the voltage VH when it is negative in polarity. Accordingly, the DC voltage difference E between the first and second gain control signals 104 and 105 may be expressed by the following equations (1) and (2) respectively when the signal 101 is positive and negative in polarity;

$$E = VH - VL = +\Delta V \tag{1}$$

(where $\Delta V > 0$)

$$E = VL - VH = -\Delta V \tag{2}$$

Hence, it can be found that the DC voltage difference E has different values such as $+\Delta V$ and $-\Delta V$.

On the other hand, the AC signal 101 sent to the first amplifier circuit 10 is applied between the gates of the first differential transistor pair (M1 and M2) and differentially amplified. Here, suppose that the voltage applied between the gates of the transistors M1 and M2 is expressed as VIN.

In addition, suppose that in the first differential transistor pair (M1 and M2), the mobility (surface mobility) is expressed as $\mu n$, the gate oxide film capacity per unit area is expressed as COX, the ratio of gate width (W) and gate length (L) is expressed as (W/L)1, the threshold voltage is expressed as VT, the voltage between the gate and source of the transistor M1 is expressed as VGS1 and the voltage between the gate and source of the transistor M2 is expressed as VGS2. Then, the drain current Id1 of the transistor M1 and drain current Id2 of the transistor M2 may be expressed as follows;

$$Id1 = \beta1 (VGS1 - VT)^2 \tag{3}$$

$$Id2 = \beta1 (VGS2 - VT)^2 \tag{4}$$

where $\beta1$ may be expressed as follows;

$$\beta1 = \mu n (COX/2)(W/L)1 \tag{5}$$

The sources of the transistors M1 and M2 are connected in common to the constant current source CS1 for generating the constant current IO and the AC signal 101 with the voltage VIN is applied between the gates of the transistors M1 and M2, so that following equations may be obtained, as $$Id1 + Id2 = IO \tag{6}$$

$$VGS1 - VGS2 = VIN \tag{7}$$

The differential output current IVIN of the first differential transistor pair (M1 and M2) applied with the input voltage VIN and driven by the constant current IO may be expressed as follows;

$$IVIN = Id1 - Id2 = \beta1(VGS1 - VT)^2 - \beta1(VGS2 - VT)^2 = \tag{8}$$

$$\beta1(VGS1 - VGS2)\{(VGS1 - VT) + (VGS2 - VT)\} =$$

$$\beta1 \cdot VIN[(Id1/\beta1)^{\frac{1}{2}} + (Id2/\beta1)^{\frac{1}{2}}] = \beta1 \cdot VIN[2\{((Id1/\beta1)^{\frac{1}{2}})^2 +$$

$$\{(Id2/\beta1)^{\frac{1}{2}}\}^2\} - \{(Id1/\beta1)^{\frac{1}{2}} - (Id2/\beta1)^{\frac{1}{2}}\}^2]^{\frac{1}{2}} = \beta1 \cdot$$

$$VIN (2IO/\beta)^{\frac{1}{2}} - VIN^2$$

In addition, from the equations (6) and (8), the following equations may be obtained;

$$Id1 = (\tfrac{1}{2})(IO + IVIN) \tag{9}$$

$$Id2 = (\tfrac{1}{2})(IO - IVIN) \tag{10}$$

Next, in the second differential transistor pair (M3 and M4) and third differential transistor pair (M5 and M6), supposing that the ratio of gate width (W) and gate length (L) is expressed as (W/L)2, the voltages between the gate and source of transistors M3, M4, M5 and M6 are respectively expressed as VGS3, VGS4, VGS5 and VGS6 and the other factors are equal to those of the first differential transistors pair M1 and M2, the drain currents Id3, Id4, Id5 and Id6 of the transistors M3, M4, M5 and M6 may be respectively expressed as follows;

$$Id3 = \beta2 (VGS3 - VT)^2 \tag{11}$$

$$Id4 = \beta2 (VGS4 - VT)^2 \tag{12}$$

$$Id5 = \beta2 (VGS5 - VT)^2 \tag{13}$$

$$Id6 = \beta2 (VGS6 - VT)^2 \tag{14}$$

where $\beta2$ may be expressed as follows;

$$\beta2 = \mu n (COX/2)(W/L)2 \tag{15}$$

In addition, the transistors M3 and M4 have their sources connected in common to the drain of the transistor M1 and the transistors M5 and M6 have their sources connected in common to the drain of the transistor M2, and the DC voltage difference E between the first and second gain control signals 104 and 105 is applied respectively between the gates of the transistors M3 and M4 and between the gates of the transistors M5 and M6, so that the following equations may be obtained;

$$Id3 + Id4 = Id1 \tag{16}$$

$$Id5 + Id6 = Id2 \tag{17}$$

$$VGS3 - VGS4 = VGS5 - VGS6 = E \tag{18}$$

As a result, the differential output current (Id3−Id4) of the second differential transistor pair (M3 and M4) and the differential output current (Id5−Id6) of the third differential transistor pair (M5 and M6) may be expressed as follows;

$$Id3 - Id4 = \beta2 \cdot E\{(2Id1/\beta2) - E^2\}^{\frac{1}{2}} \tag{19}$$

$$Id5 - Id6 = \beta2 \cdot E\{(2Id2/\beta2) - E^2\}^{\frac{1}{2}} \tag{20}$$

The differential output current IOUT of the second amplifier 11 may be expressed as a difference between the addition of the drain currents Id3 and Id6 and the addition of the drain currents Id4 and Id5, thus the following equation may be obtained;

$$\begin{aligned} IOUT &= (Id3 + Id6) - (Id4 + Id5) \\ &= (Id3 - Id4) - (Id5 - Id6) \end{aligned} \tag{21}$$

By substituting the equations (19) and (20) into the equation (21), and further substituting the equations (9) and (10) thereinto, the following equation may be obtained;

$$IOUT = \tag{22}$$

$$\beta2 \cdot E\{(2 \cdot Id1/\beta2) - E^2\}^{\frac{1}{2}} - \beta2 \cdot E\{(2 \cdot Id2/\beta2) - E^2\}^{\frac{1}{2}} =$$

$$\beta2 \cdot E[\{(IO + IVIN)/\beta2 - E^2\}^{\frac{1}{2}} - \{(IO - IVIN)/\beta2 - E^2\}^{\frac{1}{2}}]$$

Here, if the differential output current (Id3−Id4) or (Id5−Id6) when the second differential transistor pair (M3 and M4) applied with the input voltage E or the third differential transistor pair (M5 and M6) is driven by a constant current (IO/2) is expressed as IE, it may be determined as follows;

$$IE = \beta2 \cdot E\{(IO/\beta2) - E^2\}^{\frac{1}{2}} \tag{23}$$

Thus, the input voltage E may be expressed in terms of the current IE as follows;

$$E^2 = (\tfrac{1}{2}\beta2)\{IO - (IO^2 - 4 \cdot IE^2)^{\frac{1}{2}}\} \tag{24}$$

where, $\beta2 \cdot E^2 < (IO/2)$.

By substituting the equation (24) into the equation (22), the differential output current IOUT may be expressed as follows;

$$IOUT = \beta2[\{IO - (IO^2 - 4 \cdot IE^2)^{\frac{1}{2}}\}/2\beta2]^{\frac{1}{2}} \times \tag{25}$$

-continued $$[[(I0 + IVIN)/\beta 2 - \{I0 - (I0^2 - 4 \cdot IE^2)^{\frac{1}{2}}\}/2\beta]^{\frac{1}{2}} -$$

$$[(I0 - IVIN)/\beta 2 - \{I0 - (I0^2 - 4 \cdot IE^2)^{\frac{1}{2}}\}/2\beta\, 2^{\frac{1}{2}}] =$$

$$[IE^2 + (\tfrac{1}{2})IVIN\{I0 - (I_o{}^2 - 4IE^2)^{\frac{1}{2}}\}]^{\frac{1}{2}} -$$

$$[IE^2 - (\tfrac{1}{2})IVIN\{I0 - (I0^2 - 4IE^2)^{\frac{1}{2}}\}]^{\frac{1}{2}} =$$

$$I_E[[1 + (IVIN/2IE^2)\{I0 - (I0^2 - 4 \cdot IE^2)^{\frac{1}{2}}\}]^{\frac{1}{2}} -$$

$$[1 - (IVIN/2 \cdot IE^2)\{I0 - (I0^2 - 4 \cdot IE^2)^{\frac{1}{2}}\}]^{\frac{1}{2}}]$$

Generally, $h(x) = (1+ax)^{\frac{1}{2}} - (1-ax)^{\frac{1}{2}}$ may be expanded in series as follows;

$$h(x) = (1 + ax)^{\frac{1}{2}} - (1 - ax)^{\frac{1}{2}} \qquad (26)$$
$$= ax + (\tfrac{1}{2})(ax)^a + \ldots$$

From the equations (25) and (26), the following equation may be obtained;

$$IOUT = I_E[[(IVIN/2 \cdot IE^2)\{I0 - (I0^2 - 4IE^2)^{\frac{1}{2}}\}] + \qquad (27)$$
$$(\tfrac{1}{2})\,[(IVIN/2 \cdot IE^2)\{I0 - (I0^2 - 4 \cdot IE^2)^{\frac{1}{2}}\}]^a + \ldots] =$$
$$I_E < [(IVIN \cdot I0/2 \cdot IE^2)\,[1 - \{1 - (2 \cdot IE^2/I0^2)\}^{\frac{1}{2}}] +$$
$$(\tfrac{1}{2})[(IVIN \cdot I0/2 \cdot IE^2)[1 - \{1 - (2IE/I0)^2\}^{\frac{1}{2}}]]>^a + \ldots]$$

Here, the currents IE and IVIN are extremely small as compared with the constant current IO, so that $\{1-(2IE/IO)^2\}^{\frac{1}{2}}$ is expanded in series and if $(IE/IO)^2 << 1$ and $(IVIN/IO)^2 << 1$, the output signal IOUT may be approximated as follows;

$$IOUT = IE[(IVIN \cdot I0/2 \cdot IE^2)\,[1 - (\tfrac{1}{2})\,(2IE/I0)^2 - \qquad (28)$$
$$(\tfrac{1}{8})(2IE/I0)^4 - \ldots\,] + (\tfrac{1}{2})[(IVIN \cdot I0/2 \cdot IE^2)\{1 - (\tfrac{1}{2})(2IE/I0)^2 -$$
$$(\tfrac{1}{8})(2IE/I0)^4 - \ldots\,\}]^3 + \ldots\,] = IE[(IVIN/I0)\,\{1 + (IE/I0)^2 +$$
$$(IE/I0)^4 + \ldots\,\} + (\tfrac{1}{2})[(IVIN/I0)\,\{1 + (IE/I0)^2 +$$
$$(IE/I0)^4 + \ldots\,\}]^3 \approx IE[(IVIN/I0) + (\tfrac{1}{2})(IVIN/I0^3 + \ldots\,] =$$
$$(IE \cdot IVIN/I0)[1 + (\tfrac{1}{2})(IVIN/I0)^2 + \ldots\,] \approx (IE \cdot IVIN/I0)$$

Consequently, the differential output signal VOUT is approximately proportional to the product of the current IE and current IVIN, and its proportional constant is (I/IO). The current IE is the differential output signal of the differential amplifier circuit driven by the constant current (IO/2) with respect to the input voltage E, and the current IVIN is the differential output signal of the differential amplifier circuit driven by the constant current IO with respect to the input voltage VIN. In addition, in the differential output signal IOUT, the linearity with respect to the current IE (namely, the linearity with respect to the input voltage E) is considerably inferior to the linearity with respect to the current IVIN (namely, the linearity with respect to the input voltage VIN). This is because the driving current becomes half, and in the equation (31), the approximate error of the current IE is considerably larger than that of the current IVIN. This is made clear when considered upon the difference between $(IE/IO)^2 = 0$ and $(\tfrac{1}{2}) \cdot (IVIN/IO)^2 = 0$.

Accordingly, the Gilbert multiplier is not adapted to such an analog multiplier that multiplies two analog signals at a high accuracy, but when the input voltage E is made a gain control signal of the direct-current in order to determine the amplification gain as in this embodiment, there does not exist the problem on the linearity with respect to the input voltage E. Namely, in such case, the current IE becomes constant, so that the differential output current IOUT is changed proportionally to the current IVIN only with the proportional constant (IE/IO). As a result, such a current that is (IE/IO) times the current IVIN can be obtained as the differential output signal IOUT by the direct-current gain control voltage E.

As explained above, when the second amplifier circuit 11 is gain-controlled by the first and second gain control signals outputted from the gain control circuit 9, if the AC signal 101 is of the positive polarity (VIN>0), from the equations (1) and (23), the differential output current IOUT may be expressed as follows;

$$\begin{aligned}
IOUT &\approx (1/I0)\beta 2 \cdot E(I0/\beta 2) - E^2\}^{\frac{1}{2}} \cdot IVIN \qquad (29)\\
&= (1/I0)\beta 2(+\Delta V)\{(I0/\beta 2) - (+\Delta V)^2)\}^{\frac{1}{2}} \cdot IVIN\\
&= (1/I0)(+IK)IVIN
\end{aligned}$$

where IK is a constant, and $$IK = \beta 2 \cdot \Delta V\}(I0/\beta 2) - \Delta V^2\}^{\frac{1}{2}} > 0.$$

If the current 101 is of the negative polarity (VIN<0), from the equations (2) and (23), the current IOUT may be expressed as follows;

$$\begin{aligned}
IOUT &\approx (1/I0)(\beta 2 \cdot E\{(I0/\beta 2) - E^2\}^{\frac{1}{2}} \cdot IVIN \qquad (30)\\
&= (1/I0)[(\beta 2(-\Delta V)\,\{(I0/\beta 2)\,(-\Delta V)^2\}^{\frac{1}{2}}]IVIN\\
&= (1/I0)(-IK)IVIN
\end{aligned}$$

As a result, from the equations (29) and (30), the differential output current IOUT may be expressed as follows;

$$\begin{aligned}
IOUT &\approx (1/I0)(\pm IK)IVIN \qquad (31)\\
&= (IK/I0)|IVIN|
\end{aligned}$$

If the output terminals 7 and 7' are connected through a load resistance RL to the current, the output voltage VOUT ($=RL \times IOUT$) may be expressed as follows;

$$\begin{aligned}
VOUT &= RL \cdot IOUT \qquad (32)\\
&\approx (RL/I0)\{\beta 2 \cdot \Delta V (I0/\beta 2 - \Delta V^2)^{\frac{1}{2}}\} \times\\
&\quad |\beta 1 \cdot VIN\{(2I0/\beta 1) - VIN^2\}^{\frac{1}{2}}|\\
&\approx (RL/I0)(\beta 2 \cdot I0)^{\frac{1}{2}}\Delta V \cdot |(2\beta 1 \cdot I0)^{\frac{1}{2}} \cdot VIN|\\
&= (2\beta 1 \cdot \beta 2)^{\frac{1}{2}}RL \cdot \Delta V \cdot |VIN|\\
&= K \cdot \Delta V|VIN|
\end{aligned}$$

where K is a constant of $(2\beta 1 \cdot \beta 2)^{\frac{1}{2}} \cdot RL$.

As clear from the above explanations, the full-wave rectified signal 102 of the alternating current 101 can be obtained as the output signal of the second amplifier 11.

The rectification circuit of this embodiment features that a clock signal is not utilized, and a direct-current gain control signal is applied to one input terminal inferior in the linearity of input/output signals of the two input terminals of the Gilbert-type amplifier thereby obtaining the rectified signal through the gain control operation by two different direct-current voltage differences, thus being simple in circuit-scale. Accordingly, the influence of clock noise can be eliminated, a full-wave rectified signal having a good signal-to-noise ratio can be obtained and because of being small in circuit-scale. MOS integrated circuits smaller in chip-size and current consumption can be realized.

Second Embodiment

Figure 2A:
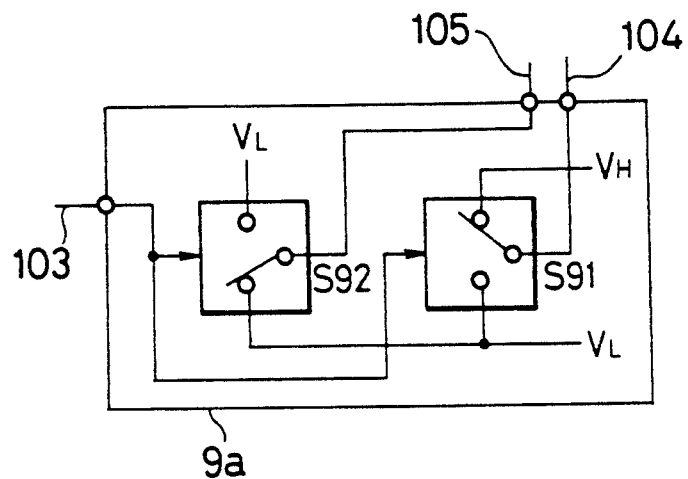
FIG. 2A is a circuit diagram of a gain control circuit used in a half-wave rectifier circuit according to a second embodiment of this invention.

FIG. 2 A shows a rectification circuit according to a second embodiment of this invention, which has a gain control circuit different as shown in FIG. 2A from that shown in FIG. 2 and which has other strucuture equal to those shown in FIG. 2. As a result, the rectification circuit of this embodiment has the same effects as those of the first embodiment.

In FIG. 2A, in a selective switch S92a of a gain control circuit 9a, a DC signal of DC voltage VL is supplied to one terminal corresponding to the terminal of the first embodiment supplied with a DC signal of DC voltage VH.

With the gain control circuit 9a, the second gain control signal 105 becomes the DC signal of the DC voltage VL in any case when the alternating current 101 is of the positive and negative polarities. As a result, the DC voltage difference E becomes different voltages, $+\Delta V$ and zero V, so that the rectification circuit of this embodiment makes it possible to obtain a half-wave rectified signal.

Third Embodiment

Figure 3A:
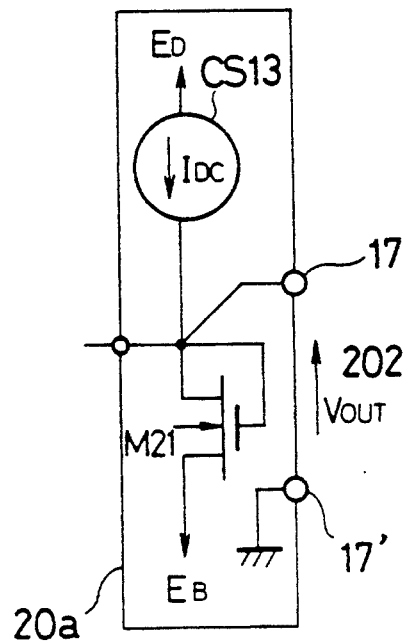
FIG. 3A is a circuit diagram of a second amplifier circuit used in a full-wave rectifier circuit according to a fourth embodiment of this invention.
Figure 3:
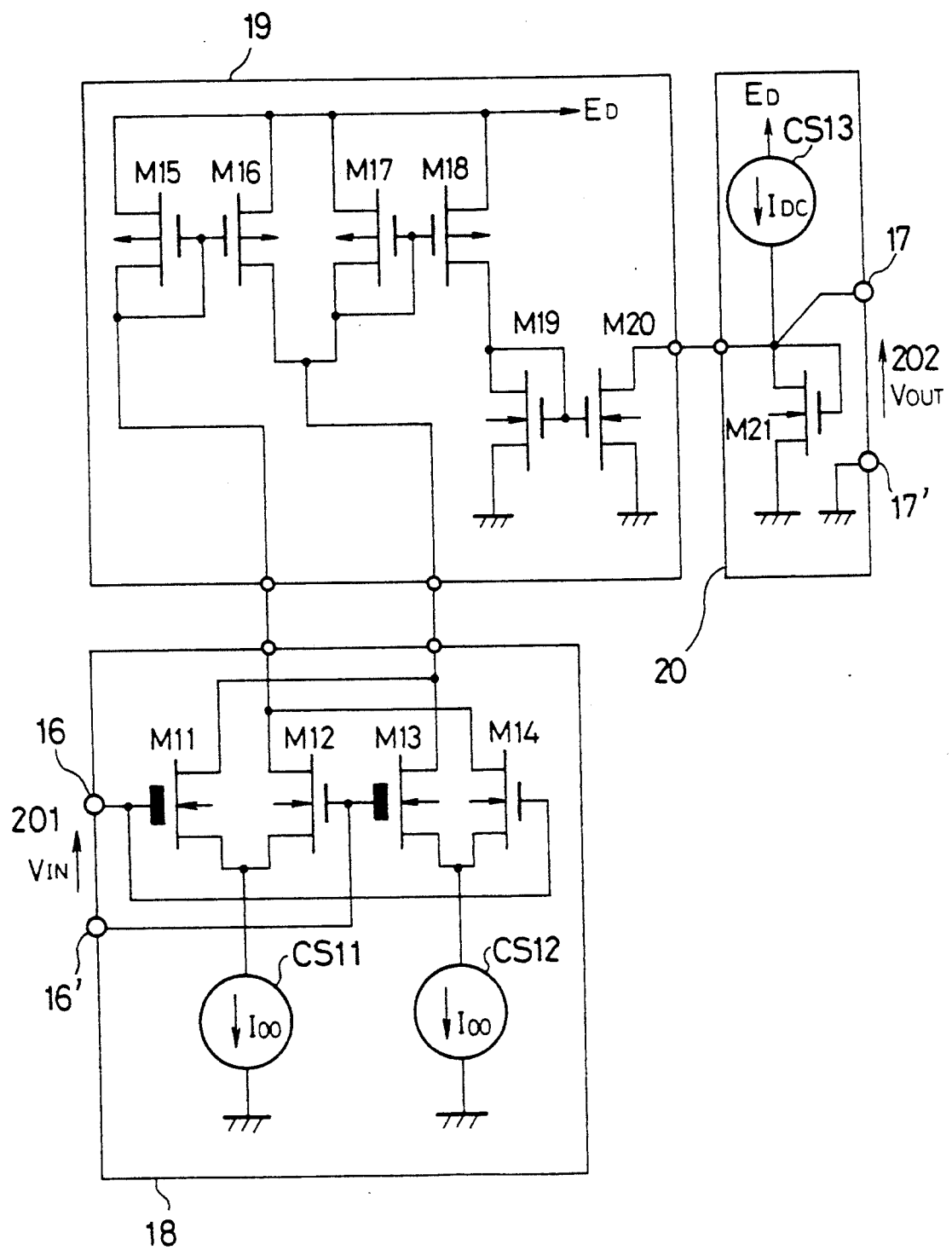
FIG. 3 is a circuit diagram of a full-wave rectifier circuit according to a third embodiment of this invention.

FIG. 3 shows a third embodiment of this invention, which is a full-wave rectifier capable of being realized with CMOS integrated circuits.

In FIG. 3, an AC signal 201 of the voltage VIN is applied to an input terminal pair (16 and 16'). A full-wave rectified signal 202 with the voltage VOUT is sent out from an output terminal pair (17 and 17').

A first amplifier circuit 18 comprises a first differential transistor pair composed of MOS transistors M11 and M12, a second differential transistor pair composed of MOS transistors M13 and M14 and two constant current sources CS11 and CS12 for generating a constant current I00, thereby differentially amplifying the AC signal 201 sent through an input terminal pair (16 and 16').

A differential output current generating circuit 19 comprises MOS transistors M15 and M16 forming a first current mirror circuit. MOS transistors M17 and M18 forming a second current mirror circuit and MOS transistors M19 and M20 forming a third current mirror circuit, thereby generating a differential output current $\Delta I$ of the first amplifier circuit 18 and outputting. In addition, ED is a power source voltage.

A second amplifier circuit 20 comprises a constant current source CS13 for generating a constant current equal to a DC component current IDC and an MOS transistor M21 driven by an AC component current IAC. The second amplifier circuit 20 drives the transistor M21 by the AC component current IAC obtained by removing the DC component current IDC from a differential output current $\Delta I$ generated by the differential output current generating circuit 19 and generates a full-wave rectified signal 202 of the AC signal 201 and outputs.

In the first differential transistor pair (M11 and M12), the width-to-length ratio (W/L) of the gate of the transistor M11 is made A times (A>1) that of the transistor M12, and the gate of the transistor M11 is connected to the input terminal 16 of the input terminal pair (16 and 16') and the gate of the transistor M12 is connected to the input terminal 16' thereof. In the second differential transistor pair (M13 and M14), the width-to-length ratio (W/L) of the gate of the transistor M13 is made A times that of the transistor M14 and the gate of the transistor M14 is connected to the input terminal 16 of the input terminal pair (16 and 16'), and the gate of the transistor M13 is connected to the input terminal 16' thereof. The drains of the transistors M11 and M13 are connected with each other and the drains of the transistors M12 and M14 are connected with each other.

The first differential transistor pair (M11 and M12) and second differential transistor pair (M13 and M14) are connected such that on the input side, the transistors having different width-to-length ratios are connected in common to form one input stage and on the output side, the transistors having the same value of that ratio are connected in common to form one output stage.

In the first differential transistor pair (M11 and M12), the sources of the transistors M11 and M12 are connected in common to the constant current source CS12 for generating constant current I00. Similarly, in the second differential transistor pair (M13 and M14), the sources of the transistors M13 and M14 are connected in common to the constant current source CS12 for generating a constant current I00.

The output stage of the first amplifier circuit 18 is connected to the input stage of the differential output current generating circuit 19. In the circuit 19, the transistors M15 and M16 form a first current mirror circuit, the transistors M17 and M18 form a second current mirror circuit and the transistors M19 and M20 form a third current mirror circuit.

The drain of the transistor M15 is connected in common to the drains of the transistors M12 and M14. The transistors M16 and M17 have respective drains connected in common and connected in common to the drains of the transistors M11 and M13. The transistors M18 and M19 have respective drains connected in common, and the drain of the transistor 20 is connected to the output stage of the differential output current generating circuit 19.

The gates of the transistors M15 and M16 are connected in common as well as to the drain of the transistor M15. The gates of the transistors M17 and M18 are connected in common as well as to the drain of the transistor M17. The transistors M15, M16, M17 and M18 are supplied through respective sources with the power source voltage ED. The gate and drain of the transistor M19 is connected to each other as well as to the drain of the transistor M18. The sources of the transistors M19 and M20 are connected respectively to the ground. The output of the differential output current generating circuit 19 is taken out from the drain of the transistor 20.

The output stage of the differential output current generating circuit 19 is connected to the input stage of the second amplifier circuit 20. In the second amplifier 20, the drain and gate of the transistor 21 are connected to each other as well as to the constant current source CS13. The drain of the transistor M21 is connected through the input stage to the drain of the transistor M20 on one hand and connected to the output terminal 17 on the other hand.

The operational principle of the full-wave rectifier circuit as structured above will be explained below.

Supposing in the differential transistor pair (M11 and M12) that the mobility is expressed as $\mu n$, the gate oxide film capacity per unit area is expressed as COX, the threshold voltage is expressed as VT, and the gate-to-source voltages of the transistor M11 and M12 are expressed respectively as VGS11 and VGS12, the drain currents Id11 and Id12 of respective transistors M11 and M12 may be expressed as follows;

$$Id11 = A \cdot \beta (VGS11 - VT)^2 \tag{33}$$

$$Id12 = \beta (VGS12 - VT)^2 \tag{34}$$

$$\beta = \mu n (COX/2)(W/L) \tag{35}$$

where the differential transistor pair (M11 and M12) may be driven by the constant current I00, the following equation may be obtained;

$$Id11 + Id12 = I00 \tag{36}$$

In addition, the AC signal 201 with the voltage VIN is applied between the gates of the transistors M11 and M12 and as a result, the following equation may be obtained;

$$VGS11 - VGS12 = VIN \tag{37}$$

From the equations (33), (34), (36), and (36) and differential output current $\Delta I11 - 12$ ($=Id11 - Id12$) of the differential transistor pair (M11 and M12) may be expressed as follows;

$$\Delta I11 - 12 = Id11 - Id12 = I00 - 2 \cdot Id12 = I0 - 2 \left\{ \frac{-A(\beta VIN)^{\frac{1}{2}} + \{A^2 \beta VIN^2 - (A + 1)(A\beta VIN^2 - I0)\}^{\frac{1}{2}}}{A + 1} \right\} = \tag{38}$$

$$\frac{(A - 1)\{(A + 1)I0 - 2A\beta VIN^2\} + 4A \cdot VIN\{(A + 1)\beta I0 - A\beta^2 VIN^2\}^{\frac{1}{2}}}{(A + 1)^2}$$

Similarly, in the differential transistor pair (M13 and M14), supposing that the gate-to-source voltages of the transistors M13 and M14 are expressed respectively as VGS13 and VGS14, the drain currents are expressed respectively as Id13 and Id14 and the other factors are expressed equally to those of the transistors M11 and M12, the following equations may be obtained;

$$Id13 = A\beta (VGS13 - VT)^2 \tag{39}$$

$$Id14 = \beta (VGS14 - VT)^2 \tag{40}$$

$$Id13 + Id14 = I0 \tag{41}$$

$$VGS13 - VGS14 = -VIN \tag{42}$$

Accordingly, the differential output current $\Delta I13 - 14$ ($=Id13 - Id14$) of the differential transistor pair (M13 and M14) may be obtained from the equations (39) to (42) as;

$$\Delta I13 - 14 = Id13 - Id14 = \frac{(A - 1)\{(A + 1)I_o - 2A\beta VIN^2\} - 4AVIN\{(A + 1)\beta I0 - A\beta^2 VIN^2\}^{\frac{1}{2}}}{(A + 1)^2} \tag{43}$$

In the first amplifier circuit 18, the differential output of the differential transistor pair (M11 and M12) and that of the differential transistor pair (M13 and M14) are combined, that is, the drain currents Id11 and Id13 are combined and the drain currents Id12 and Id14 are combined, thus one differential output being formed. As a result, the differential output current $\Delta I$ of the first amplifier circuit 18 may be expressed as follows;

$$\begin{aligned}\Delta I &= (Id11 + Id13) - (Id12 + Id14) \\ &= (Id11 - Id12) + (Id13 - Id14) \\ &= \Delta I11 - 12 + \Delta I13 - 14\end{aligned} \tag{44}$$

Here, by substituting the equations (38) and (43) into the equation (44), the differential output $\Delta I$ may be obtained as follows;

$$\begin{aligned}\Delta I &= \frac{2(A - 1)\{(A + 1)I0 - 2A\beta \cdot VIN^2\}}{(A + 1)^2} \\ &= \frac{2(A - 1)}{A + 1} I0 - \frac{4A(A - 1)\beta}{(A + 1)^2} VIN^2 \\ &= IDC - IAC\end{aligned} \tag{45}$$

where $$IDC = \frac{2(A - 1)}{A + 1} I0, \quad IAC = \frac{4A(A - 1)\beta}{(A + 1)^2} VIN^2$$

From the equation (45), it can be found that the differential output current $\Delta I$ of the first amplifier circuit 18 is made of a constant DC component current IDC determined dependingly on the constant current I00 and an AC component current IAC changed dependingly on the voltage VIN of the AC signal 201.

On the other hand, in the differential output current generating circuit 19, referring to the transistors M15 and M16 of the first current mirror circuit, the transistors M17 and M18 of the second current mirror circuit and the transistors M19 and M20 of the third current mirror circuit, if the drain currents of the transistors M15, M16, M17, M18, M19 and M20 are expressed respectively as Id15, Id16, Id17, Id18, Id19 and Id20, the following equations may be obtained by the current mirror effect;

$$Id15 = Id16 \tag{46}$$

$$Id17 = Id18 \tag{47}$$

$$Id19 = Id20 \tag{48}$$

In addition, the drain of the transistor 15 is connected to the commonly connected drains of the transistors M12 and M14 of the first amplifier circuit 18, the drains of the transistors M16 and M17 are connected to each other as well as to the commonly connected drains of the transistors M11 and M13 of the first amplifier circuit 18, and the drain of the transistor M18 is connected to the drain of the transistor 19, so that the following equations may be obtained;

$$Id15 = Id12 + Id14 \quad (49)$$

$$Id16 + Id17 = Id11 + Id13 \quad (50)$$

$$Id18 = Id19 \quad (51)$$

Therefore, the drain current Id20 of the transistor M20 can be obtained by subsequently substituting the equations (51), (47), (50), (46) and (49) into the equation (48) and further by substituting the equations (38) and (34) thereinto, which may be expressed as follows;

$$\begin{aligned}Id20 &= (Id11 + Id13) - (Id12 + Id14) \\ &= (Id11 - Id12) + (Id13 - Id14) \\ &= \Delta I11 - 12 + \Delta I13 - 14 = \Delta I\end{aligned} \quad (52)$$

From the equation (52), it can be found that the differential output current ΔI of the first amplifier circuit 18 is generated by the current mirror effect in the differential output current generating circuit 19. The differential output current ΔI, namely, the drain current Id20 of the transistor M20 is made of the DC component current IDC and the AC component current IAC as shown in the equation (45).

In the second amplifier circuit 20, the constant current source CS13 generates a constant current equal to the above-mentioned DC component current IDC. The constant current thus generated is combined with the drain current Id20 of the transistor M20, namely, with the differential output signal ΔI and the current obtained resulting from the combination effects to drive the transistor M21. As a result, the drain current Id21 of the transistor M21 may be obtained as follows;

$$\begin{aligned}Id21 &= IDC - Id20 = IDC - \Delta I \\ &= IDC - (IDC - IAC) = IAC\end{aligned} \quad (53)$$

As shown above, in the second amplifier circuit 20, the constant current source CS13 serves to remove the DC component current IDC from the differential output current ΔI and as a result, the transistor M21 is driven by the AC component current IAC thus obtained by removing the DC component current IDC therefrom.

Supposing that the gate-to-source voltage of the transistor M21 is expressed as VGS21 and the drain-to-source voltage thereof is expressed as VDS21, as the gate and drain of the transistor M21 are connected to each other, VGS21=VDS21 may be obtained. And, as that drain is connected to the output terminal 17, if the voltage between the output terminals 17 and 17' is expressed as VOUT, VGS21=VDS21=VOUT may be obtained. Therefore, the drain current Id21 of the transistor M21 may be obtained as follows;

$$\begin{aligned}Id21 &= \beta \, (VGS21 - VT)^2 \\ &= \beta \, (VOUT - VT)^2\end{aligned} \quad (54)$$

By obtaining the output voltage VOUt from the equation (54) and substituting $$IAC = 4A(A-1) \cdot VIN^2/(A+1)^2$$

thereinto, the output voltage VOUT may be obtained as follows:

$$\begin{aligned}VOUT &= (Id21/\beta)^{\frac{1}{2}} + VT = (IAC/\beta)^{\frac{1}{2}} + VT \\ &= \{4A(A-1)VIN^2/(A+1)^2\}^{\frac{1}{2}} + VT \\ &= [2\{A(A-1)\}^{\frac{1}{2}}/(A+1) \cdot |VIN| + VT\end{aligned} \quad (55)$$

From the equation (55), it can be found that the bias voltage equal to the threshold voltage VT is applied across the output terminal pair (7 and 7') and the signal 202 obtained by full-wave rectifying the input signal 201 with the voltage VIN is outputted therefrom.

As explained above, the full-wave rectifier circuit of this third embodiment has such a structure that does not need to use a clock signal and that the inputted AC signal is differentially amplified, thereafter generating a differential output current t by the current mirror effect, and the DC component current is removed from that current thereby obtaining the AC component current varied depending on the voltage of the inputted AC signal, thus generating a full-wave rectified signal. This means that a rectifier circuit which is simple in circuit-scale can be realized.

Consequently, a rectifier circuit capable of obtaining a full-wave rectified signal with no effect of clock noise and a superior signal-to-noise ratio can be realized. Besides, as it is simple in structure, it can be realized with MOS integrated circuits which are small in chip-size as well as small in current consumption.

Fourth Embodiment

FIG. 3A shows the full-wave rectifier circuit of a fourth embodiment in this invention. This rectifier circuit has modified the construction of the second amplifier circuit of the rectifier circuit of embodiment 3 above as shown in FIG. 3A, and constructions except for the second amplifier circuit are the same as the third embodiment above. Therefore, the same effect as the third embodiment can be obtained.

In this embodiment 4, the source of transistor M21 of the second amplifier circuit 20a is not grounded, while, in place of the grounding, the source is connected to the DC bias power source of the voltage EB equal to the threshold voltage VT. Therefore, the following equation is formed.

$$VGS21 = VDS21 = VOUT + EB = VOUT + VT$$

The output voltage VOUT is represented as shown in the following equation (56), therefore, there is a effect that the full-wave rectified signal 102 having no bias voltage can be obtained.

$$VOUT = 2\{A(A-1)\}^{\frac{1}{2}}|VIN|/(A+1) \quad (56)$$

Fifth Embodiment

Figure 4:
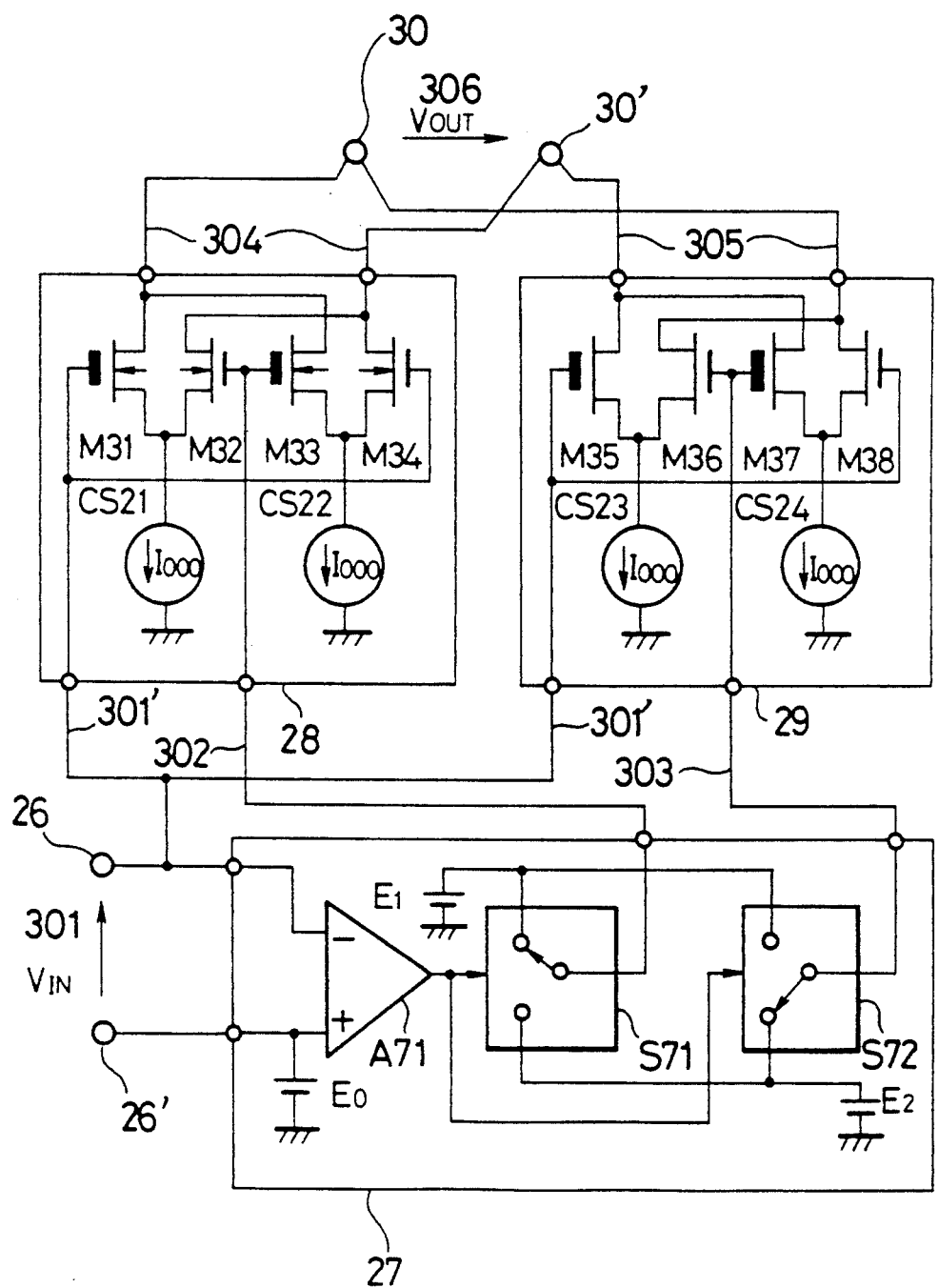
FIG. 4 is a circuit diagram of a full-wave rectifier circuit according to a fifth embodiment of this invention.

FIG. 4 shows a fifth embodiment of this invention. This circuit is a full-wave rectifier, and is composed using MOS transistors so as to realize on an MOS integrated circuit.

In FIG. 4, for an input terminal pair (26, 26'), an AC signal 301 of voltage VIN is applied. A polarity judgment circuit 27 comprises a comparator A71 and two selective switches S71 and S72. The circuit 27 judges the positive/negative polarity of voltage VIN of the AC signal 301, and generates and outputs a first DC signal 302 and a second DC signal 303 conforming to the judged result.

A first differential amplifier circuit 28 comprises a differential transistor pair composed of MOS transistors M31 and M32, a second differential transistor pair composed of MOS transistors M33 and M34, and two constant current sources CS21 and CS22 for generating constant currents I000. The circuit 28 performs the differential amplification of the AC signal 301' and the first DC signal 302 on the input terminal 26 side to generate and output a first differential output signal 304.

A second differential amplifier circuit 29 comprises a third differential transistor pair composed of MOS transistors M35 and M36, a fourth differential transistor pair composed of MOS transistors M37 and M38, and two constant current sources CS33 and CS34 for generating constant currents I000. The circuit 29 performs the differential amplification of the AC signal 301' and the second DC signal 303 to generate and output the second differential output signal 305.

From the differential output terminal pair (30, 30'), a rectifier signal 306 of voltage VOUT is outputted. E0 shows a DC bias voltage and E1, E2 show DC voltages.

In the polarity judgment circuit 27, the AC signal 301 applied to the input terminal pair (26, 26') is supplied between the + input terminal and the − input terminal of comparator A71. For the + input terminal of comparator A71, the DC bias voltage E0 is applied. When the voltage VIN of AC signaL 301 is equal to the DC bias voltage E0 or larger than that voltage (VIN≧E0), the output signal of comparator A71 becomes a low logical level (Logical level "0"), and when the voltage VIN of AC signal 301 is smaller than the DC bias voltage E0 (VIN<E0), the output signal becomes a high logical level (Logical level "1").

The selective switches S71 and S72 are controlled so as to select and output the DC voltage E1 or E2 corresponding to the output signal of comparator A71. Namely, when the output signal of comparator A71 is in a logical level "0", the selective switch S71 is controlled so that the DC voltage E1 can be selected, and when the output signal of comparator A71 is in a logical level "1", the selective switch S71 is controlled so that the DC voltage ES can be selected. When the output signal of comparator A71 is in a logical level "0", the selective switch S72 is controlled so that the DC voltage E2 can be selected, and when the output signal of comparator A71 is in a logical level "1", the selective switch S72 is controlled so that the DC voltage E1 can be selected.

Namely, the positive/negative polarity of voltage VIN of AC signal 301 is judged by the comparator A71, and when the judged result is "Positive polarity", the first DC signal 302 output from the selective switch S71 becomes the DC signal of DC voltage E1, and the second DC signal 303 output from the selective switch S72 becomes the DC signal of DC voltage E2. When the judged result is "Negative polarity", the first DC signal 302 becomes the DC signal of DC voltage E2, and the second DC signal 303 becomes the DC signal of DC voltage E1.

When the DC voltage E1 is set to $$E1 = E0 + \Delta E/2.$$

and when the DC voltage E2 is set to $$E2 = E0 - \Delta E/2$$

beforehand, if the voltage VIN of AC signal 301 is "Positive polarity", the DC voltage difference between the first DC signal 302 and the second DC signal 303 is represented as shown in the following equation.

$$E1 - E2 = (E0 + \Delta E/2) - (E0 - \Delta E/2) = +\Delta E$$

and for "Negative polarity", the DC voltage difference is represented as shown in the following equation.

$$E2 - E1 = (E0 - \Delta E/2) - (E0 + \Delta E/2) = -\Delta E$$

Namely, in the polarity judgment circuit 27, the positive/negative polarity of voltage VIN of AC signal 301 is judged by the comparator A71, and the first DC signal 302 and the second DC signal 303, which are in the relation having the predetermined specified DC voltage difference (herein, means $+\Delta E$ and $-\Delta E$), which are different for "Positive polarity" and for "Negative polarity", are generated to be output.

The AC signal on the input terminal 26 side, namely, the AC signal 301' of voltage (VIN+E0) and the first DC signal 302, which is the output of one side of the polarity judgment circuit, are inputted in the first differential amplifier circuit 28. This AC signal 301' and the second DC signal 303 which is the output of another side of the polarity judgment circuit 27, are inputted to the second differential amplifier circuit 29.

In the first differential amplifier circuit 28, the source of the first differential transistor pair (M31, M32) is connected in common to the constant current source CS21, and the source of second differential transistor pair (M33, M34) is connected in common to the constant current source CS22, and these differential transistor pairs (M31, M32) (M33, M34) are driven by the constant current I000 respectively. The capacity value of transistor M31 namely, the ratio (W/L) between the gate width (W) and the gate length (L) is A times (A>1) of the ratio (W/L) of transistor M32, and the ratio (W/L) of transistor M33 is A times of the ratio (W/L) of transistor M34.

Between the first differential transistor pair (M31, M32) and the second differential transistor pair (M33, M34), the gates of the transistors M31 and M34 and the gates of the transistors M32 and M33 are connected each other respectively, and according to this connection, the input terminal pair of the first differential amplifier circuit 28 is formed. This means that the gate of transistor whose capacity value is larger and the gate of transistor whose capacity value is smaller are connected each other in the input side. The drains of the transistors M31 and M33 and the drains of the transistors M32 and M34 are connected each other respectively, and according to the connection, the output terminal pair of the first differential amplifier circuit 28 is formed. This means that the drains of the transistor whose capacity value is larger and the drains of the transistor whose capacity value is smaller are connected each other in the output side.

The second differential amplifier circuit 29 has the same circuit construction as the first differential amplifier circuit 28. For the construction factors between the circuits 28 and 29, the transistors M31 and M35, transistors M32 and M36, transistors M33 and M37, transistors M34 and M38, the constant current sources CS21 and CS23, and the constant current sources CS22 and CS24, correspond respectively.

The AC signal 301' is inputted in one terminal of the input terminal pair of the first differential amplifier circuit 28, and the first DC signal 302 is inputted in the other terminal of the input terminal pair. Here, the AC signal 301' is supplied to the gates of transistors M31 and M34, and the first DC signal 302 is supplied to the gates of transistors M32 and M33, however, it is permissible to set the terminal in which the AC signal 301' and the first DC signal 302 are inputted to the inverse. The AC signal 301' is also inputted in one terminal of the input terminal pair of the second differential amplifier circuit 29, and the second DC signal 303 is inputted in the other terminal of the input terminal pair. Here, the AC signal 301' is supplied to the gates of transistors M35 and M38, and the second DC signal 303 is supplied to the gates of transistors M36 and M37, however, it is permissible to set the terminal in which the AC signal 301' and the second DC signal 303 are inputted to the inverse.

In the first differential amplifier circuit 28, the differential amplification of the AC signal 301' and the first DC signal 302 is performed to generate the first differential output signal 304. In the second differential amplifier circuit 29, the differential amplification of the AC signal 301' and the second DC signal 303 is performed to generate the second differential output signal 305. For the first differential output signal 304, the output of the first differential transistor pair (M31, M32) side is sent to the terminal 30 of the output terminal pair (30, 30'), and the output of the second differential transistor pair (M33, M34) side is sent to the terminal 30' thereof. In the same way as above, for the second differential output signal 305, the output of the third differential transistor pair (M35, M36) side is sent to the terminal 30', and the output of the fourth differential transistor pair (M37, M38) side is sent to the terminal 30. Therefore, the first differential output signal 304 and the second differential output signal 305 are synthesized so as to become the antiphase each other, and the full-wave rectified signal 306 of voltage VOUT is outputted from the output terminal pair (30, 30').

Hereafter, the operational principle of the differential amplification in the first differential amplifier circuit 28 is explained.

Assuming the mobility of transistors M31 to M34 as $\mu n$, the capacity of gate oxide film per unit area as COX, and the threshold voltage as VT. When the voltage between the gates and sources of transistors M31 and M32 is set to VGS31 and VGS32 each, the drain current Id31 and Id32 of transistors M31 and M32 are expressed by the following equations (57) and (58), where $\beta$ is expressed as the following equation (59)

$$Id31 = A\beta(VGS31 - VT)^2 \tag{57}$$

$$Id32 = \beta(VGS32 - VT)^2 \tag{58}$$

$$\beta = \mu n(COX/2)(W/L) \tag{59}$$

Since the first differential transistor pair (M31, M32) is driven at constant current I000, the following equation (60) is established.

$$Id31 + Id32 = I000 \tag{60}$$

When the voltage between gates of transistors M31 and M32 is set to VA, the following equation (61) is established.

$$VGS31 - VGS32 = VA \tag{61}$$

The differential output current $\Delta I31-32$ (=Id31-Id32) of the first differential transistor pair (M31, M32) is represented as shown in the following equation (62) by solving the equations (57), (58), (59), and (60).

$$\Delta I31 - 32 = Id31 - Id32 = I000 - 2 \cdot Id32 \tag{62}$$

$$= I000 - 2\left(\frac{-A \cdot \beta^{\frac{1}{2}} \cdot V_A + \{A^2 \cdot \beta \cdot VA^2 - (A+1)(AB \cdot VA^2 - I000)\}^{\frac{1}{2}}}{A+1}\right)^2$$

$$= \frac{(A-1)\{(A+1)I000 - 2A\beta \cdot VA^2\} + 4A \cdot VA\{(A+1)\beta I000 - A \cdot \beta^2 \cdot VA^2\}^{\frac{1}{2}}}{(A+1)^2}$$

For the second differential transistor pair (M33, M34), the differential output current $\Delta I33-34$ can be obtained in the same way as the case of the first differential transistor pair (M31, M32) mentioned above, except for the point, wherein the voltage between gates of transistors M33 and M34 is set to the following equation, is different.

$$VGS33 - VGS34 = -VA$$

When the result only is shown, the differential output current $\Delta I33-34$ (=Id33-Id34) is represented as shown in the following equation (63).

$$\Delta I33 - 34 = Id33 - Id34 \tag{63}$$

$$= \frac{(A-1)\{(A+1)I000 - 2A\beta \cdot VA^2\} - 4AVA\{(A+1)\beta I000 - A \cdot \beta^2 \cdot VA^2\}^{\frac{1}{2}}}{(A+1)^2}$$

In this embodiment, the differential output of the first differential transistor pair (M31, M32) and the differential output of the second differential transistor pair (M33, M34) are synthesized to generate the first differential output signal 304. Namely, since the drain current Id31 and Id33 are synthesized, and the drain current Id32 and Id34 are synthesized, to generate the first differential output signal 304, the differential output current $\Delta IA$ is represented as shown in the following equation (64).

$$\Delta IA = (Id31 + Id33) - (Id32 + Id34) \tag{64}$$
$$= (Id31 - Id32) + (Id33 - Id34)$$
$$= \Delta I31 - 32 + \Delta I33 - 34$$
$$= \{2(A-1)/(A+1)\}I000 -$$

-continued $$\{4A(A-1)\beta/(A+1)^2\}\,VA^2$$

Therefore, it can be known that the differential output current ΔIA of the first differential output signal 304 is formed by the current component determined related to the constant current I000 and the current component determined related to the voltage VA between gates of transistors M31 and M32.

In the second differential amplifier circuit 29, the differential amplification of the AC signal 301' and the second DC signal 303 is performed to generate the second differential output signal 305. The circuit construction of the second differential amplifier circuit 29 is the same as the circuit construction of the first differential amplifier circuit 28, and the transistor characteristics of the third differential transistor pair (M35, M36) and the fourth differential transistor pair (M37, M38) are the same as that of the first differential transistor pair (M31, M32) and the second differential transistor pair (M33, M34). Therefore, the differential output current ΔIB of the differential output signal 305 is represented as shown in the following equation (65). Provided, the voltage between gates of transistors M35 and M36 is assumed as VGS35−VGS36=VB, and the voltage between gates of transistors M37 and M38 is assumed as VGS37−VGS38=−VB.

$$\Delta IB = \{2(A-1)/(A+1)\}I0 - \{4A(A-1)\beta/(A+1)^2\}VB^2 \quad (65)$$

The first differential output signal 304 and the second differential output signal 305 are sent to the differential output terminal pair (10, 10'), however, the connection between both signals 304 and 305 is in the relation where these two signals 304 and 305 are added in the antiphase. Therefore, the differential output current ΔI of the signal 306 output from the output terminal pair (10, 10') is represented as shown in the following equation (66).

$$\Delta I = \Delta IA - \Delta IB \quad (66)$$
$$= \{4A(A-1)\beta/(A+1)^2\}(VB^2 - VA^2)$$

Here, when the voltage VIN of AC signal 301 is "Positive polarity" (VIN≧0), as mentioned above, the voltage of the first DC signal 302 is shown below.

$$E1 = E0 + \Delta E/2$$

And the voltage of the second DC signal 103 is shown below.

$$E2 = E0 - \Delta E/2$$

And the voltage of AC signal 301' is (VIN+E0). Therefore, the voltage VA and VB are represented as shown in the following equations (67) and (68).

$$VA = (VIN + E0) - (E0 + \Delta E/2) \quad (67)$$
$$= VIN - \Delta E/2$$

$$VB = (VIN + E0) - (E0 - \Delta E/2) \quad (68)$$
$$= VIN + \Delta E/2$$

When the equations (67) and (68) are substituted in the equation (66), the differential output current ΔI is represented as shown in the following equation (69).

$$\Delta I = \{(8A(A-1)\beta/(A+1)^2\} \cdot (+\Delta E) \cdot VIN \quad (69)$$
$$= \{(8A(A-1)\beta/(A+1)^2\} \cdot \Delta E \cdot |VIN|$$
$$(VIN \geq 0)$$

When the voltage VIN of AC signal 301 is "Negative polarity" (VIN<0), as mentioned above, the voltage of the first DC signal 302 is represented as shown in the following equation.

$$E2 = E0 - \Delta E/2$$

The voltage of the second DC signal 103 is represented as shown in the following equation.

$$E1 = E0 + \Delta E/2$$

Therefore, the voltage VA and VB are represented as shown in the following equations (70) and (71).

$$VA = (VIN + E0) - (E0 - \Delta E/2) \quad (70)$$
$$= VIN + \Delta E/2$$

$$VB = (VIN + E0) - (E0 + \Delta E/2) \quad (71)$$
$$= VIN - \Delta E/2$$

When the equations (70) and (71) are substituted in the equation (66), the differential output current ΔI is represented as shown in the following equation (72).

$$\Delta I = \{(8A(A-1)\beta/(A+1)^2\} \cdot (-\Delta E) \cdot VIN \quad (72)$$
$$= \{(8A(A-1)\beta/(A+1)^2\} \cdot (-\Delta E) \cdot |VIN|$$
$$(VIN < 0)$$

Consequently, as shown in the equations (69) and (72), the differential output current ΔI is proportion to the absolute value |VIN| of the voltage VIN of AC signal 301, and it can be known that the full-wave rectifier signal 306 is obtained from the differential output terminal pair (10, 10').

When the voltage is taken out by connecting the load resistor RL between the output terminals 10 and 10', the voltage VOUT of the full-wave rectifier signal 306 is represented as shown in the following equation (73).

$$VOUT = RL \cdot \Delta I \quad (73)$$
$$= \{8A(A-1)\beta/(A+1)^2\} \cdot RL \cdot \Delta E \cdot |VIN|$$

As mentioned above, since the full-wave rectifier circuit of this fifth embodiment has the circuit construction to generate the rectifier signal without using a clock signal, the rectifier signal of good ratio of signal/noise having no influence of clock noise can be obtained.

Sixth Embodiment

Figure 4A:
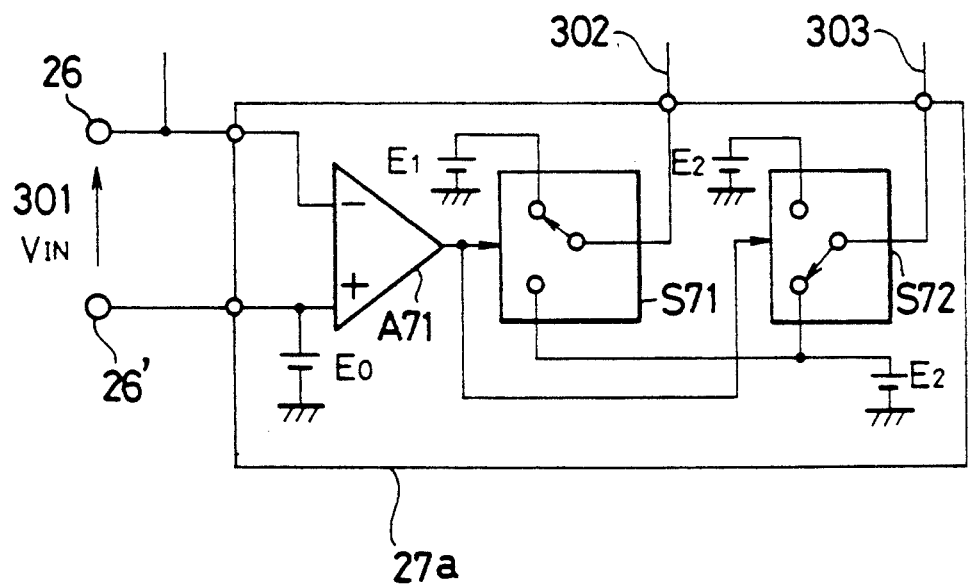
FIG. 4A is a circuit diagram of a polarity judgment circuit used in a half-wave rectifier circuit according to a sixth embodiment of this invention.

FIG. 4A shows the half-wave rectifier circuit of a sixth embodiment of this invention. This rectifier circuit has changed the construction of the polarity judgment circuit of embodiment 5 above, as shown in FIG. 4A, and the constructions except for the polarity jugdment circuit are the same as the fifth embodiment above. Therefore, the same effect as the fifth embodiment can be obtained.

In this embodiment, the selective switch S72 of the polarity judgment circuit 27a always selects the DC voltage E2, therefore, the voltage of the second DC signal 303 always becomes E2 without dependency of the positive/negative polarity judged result of the voltage VIN of AC signal 301. According to this reason, the DC voltage difference between the first DC signal 302 and the second DC signal 303 exhibits the different specified DC voltage difference, wherein the DC voltage difference is [+ΔE] when the voltage of AC signal 301 is "Positive polarity" (VIN≧0), and the DC voltage difference is [Zero] when the voltage of AC signal 301 is "Negative polarity⇌ (VIN<0). Consequently, the differential output current ΔI of equation (72) (or the differential output current ΔI of equation (13)) becomes zero, and the half-wave rectified signal can be obtained.

In the same way as above, for the selective switch S71, even if, for embodiment, the DC voltage E1 is always selected, the half-wave rectifier signal can be obtained.

In the above embodiments, any of circuits using MOS transistors is shown, however, the same effect of this invention can be obtained using bipolar transistors in place of the MOS transistors, or it is permissible to realize the same effect in the bipolar-MOS integrated circuit using the both transistors.

When a bipolar transistor is used, it is enough to perform the same analysis as above using the various characteristics of bipolar transistor in place of the operational principle of each MOS transistor above. In this case, as a capacity value of bipolar transistor, the emitter area (size) shall be used, and the measure shall be taken, when the emitter size of one side of two bipolar transistors, which compose the differential transistor pair, is set to 1, the emitter size of another transistor becomes A.

The present invention is not only limited to each element used in the above embodiments, but also the elements except for the elements described here are also usable if the elements can play the same function.

What is claimed is:

1. A rectifier circuit without using a clock signal comprising:
   a polarity judgment circuit, a gain control circuit, a first amplifier circuit and a second amplifier circuit, wherein:
   said polarity judgment circuit receives an AC signal and judges the positive/negative polarity of voltage of said AC signal to output a polarity specification signal.
   said gain control circuit receives said polarity specification signal and outputs a first gain control signal and a second gain control signal having a different DC voltage difference between the times when the polarity specification signal shows the judged result of "Positive polarity" and when said polarity specification signal shows the judged result of "Negative polarity",
   said first amplifier circuit comprises a first transistor pair connected to a constant current source, and receives said AC signal to amplify said AC signal differentially,
   said second amplifier circuit comprises a second differential transistor pair and a third differential transistor pair, said differential input terminals of which are connected in common respectively, and these transistor pairs receive said first gain control signal and said second gain control signal through said differential input terminals respectively, to be gain controlled by said DC voltage difference between said first gain control signal and said second gain control signal.
   said second differential transistor pair connected to one transistor of said first differential transistor pair as well as said third differential transistor pair is connected to the other transistor of said first differential transistor pair,
   said differential output terminal of said second differential transistor pair and said differential output terminal of said third differential transistor pair are connected in common, and a rectifier signal is outputted from said differential output terminals thus connected in common, and
   in said transistors of said second differential transistor pair and said third differential transistor pair, said differential input terminals of the transistors, whose differential output terminals are not connected each other, are connected in common.

2. A rectifier circuit as claimed in claim 1, wherein said DC differences between said first gain control signal and said second gain control signal are not zero in the case of positive polarity and negative polarity of voltage of said AC signal, whereby a full-wave rectifier is performed.

3. A rectifier circuit as claimed in claim 1, wherein said DC differences between said first gain control signal and said second gain control signal are zero in one of the case of positive polarity and negative polarity of voltage of said AC signal, whereby a half-wave rectifier is performed.

4. A rectifier circuit as claimed in claim 1, wherein said polarity judgment circuit is composed of a comparator.

5. A rectifier circuit as claimed in claim 1, wherein said gain control circuit comprises a switching element which select and output two different voltages corresponding to the judged result of said polarity judgment circuit.

6. A rectifier circuit as claimed in claim 1, wherein said first differential transistor pair, said second differential transistor pair and said third differential transistor pair comprises MOS transistors respectively.

7. A full-wave rectifier circuit without using a clock signal comprising:
   a first amplifier circuit, a differential output current generation circuit and a second amplifier circuit, wherein:
   said first amplifier circuit comprises two sets of differential transistor pairs in which the capacity value of one transistor is A times (A>1) the capacity value of the other transistor respectively, and between said two sets of said differential transistor pairs, in the input side, said transistors whose capacity values are different are connected in common to form one input stage, and in the output side, said transistors whose capacity values are the same are connected in common to form one output stage, and said two sets of differential transistor pairs each having a constant current source, and said AC signal applied to the input stage is amplified differentially, said differential output current generation circuit is connected to the output stage of the first amplifier circuit, and said current generation circuit generates by the current mirror operation a differential output current which includes a DC component current of constant value obtained as a current difference of output currents of said first amplifier circuit and determined in relation to the constant current, and an AC component current which changes in relation to the voltage of the AC signal, said second amplifier circuit is connected to the output stage of said differential output current generation circuit and is provided with means for removing the DC component current from said differential output current, the AC component current obtained by removing the DC component current generates a full-wave rectified signal of said AC signal by driving said transistor which compose said second amplifier circuit.

8. A full-wave rectifier circuit as claimed in claim 7, wherein, said differential transistor pairs of said first amplifier circuit and said second amplifier circuit comprise MOS transistors respectively and, the ratio (W/L) of one transistor composing said respective differential transistor pair is A times of the ratio (W/L) of the other transistor thereof.

9. A full-wave rectifier circuit as claimed in claim 7, wherein, said differential output current generation circuit comprises current mirror circuits.

10. A full-wave rectifier circuit as claimed in claim 7, wherein, said means for removing said DC component current from said differential output current is composed of a constant current source.

11. A full-wave rectifier circuit as claimed in claim 7, wherein, said second amplifier circuit is provided with a bias voltage source which supplies a voltage to cancel a bias voltage included in said full-wave rectified signal.

12. A rectifier circuit without using a clock signal comprising:

a polarity judgment circuit, a first differential amplifier circuit, a second differential amplifier circuit and differential output terminals, wherein;

said polarity judgment circuit receives an AC signal and judges said positive/negative polarity of voltage of said AC signal to output a first DC signal and a second DC signal which have different specified DC voltage differences in the cases of "Positive polarity" and "Negative polarity", said first differential amplifier circuit comprises two sets of differential transistor pairs in which the capacity value one transistor is A times (A>1) of the capacity value of the other transistor respectively, and these transistor pairs each having a constant current source, and between these two sets of differential transistor pairs, in the input side, an input terminal pair is formed by connecting said transistor of one set of said transistor pair whose capacity value is larger and said transistor of the other set of the transistor pair whose capacity value is smaller, and in the output side, said output terminal pair is formed by connecting said transistors of said two sets of said transistor pairs whose capacity values are larger and by connecting said transistors of the other set of said transistor pairs whose capacity values are smaller, and said AC signal is applied to one terminal of said input terminal pair and said first DC signals applied to the other terminal of said input terminal pair to be amplified by said first differential amplifier circuit differentially, a first differential output signal being outputted from said output terminal pair, said second differential amplifier circuit is of the same circuit construction as said first differential amplifier circuit, and said AC signal is applied to one terminal of said input terminal pair and said second DC signal is applied to said the other terminal of said input terminal pair to be amplified by said second differential amplifier circuit differentially, a second differential output signal being outputted from said output terminal pair, and said differential output terminals are connected so that said first differential output signal and said second differential output signal may be synthesized on antiphase basis.

13. A rectifier circuit as claimed in claim 12, wherein said DC differences between said first gain control signal and said second gain control signal are not zero in the case of positive polarity and negative polarity of voltage of said AC signal, whereby a full-wave rectifier is performed.

14. A rectifier circuit as claimed in claim 12, wherein said DC differences between said first gain control signal and said second gain control signal are zero in one of the case of positive polarity and negative polarity of voltage of said AC signal, whereby a half-wave rectifier is performed.

15. A rectifier circuit as claimed in claim 12, wherein said differential transistor pairs of said first differential amplifier circuit and said second differential amplifier circuit comprise MOS transistors respectively and, the ratio (W/L) of one transistor composing said respective differential transistor pair is A times the ratio (W/L) of the other transistor thereof.

16. A rectifier circuit as claimed in claim 12, wherein said polarity judgment circuit comprises a comparator and a switching element which selects and outputs different two types of DC signals corresponding to an output of said comparator.

* * * * *